United States Patent
Tsukuda et al.

(10) Patent No.: US 12,300,569 B2
(45) Date of Patent: May 13, 2025

(54) SEMICONDUCTOR DEVICE

(71) Applicant: Mitsubishi Electric Corporation, Tokyo (JP)

(72) Inventors: Masanori Tsukuda, Tokyo (JP); Koichi Nishi, Tokyo (JP); Shinya Soneda, Tokyo (JP); Koji Tanaka, Tokyo (JP); Norikazu Sakai, Tokyo (JP); Taketoshi Shikano, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 391 days.

(21) Appl. No.: 17/857,293

(22) Filed: Jul. 5, 2022

(65) Prior Publication Data

US 2023/0187308 A1 Jun. 15, 2023

(30) Foreign Application Priority Data

Dec. 13, 2021 (JP) ................................. 2021-201732

(51) Int. Cl.
*H01L 23/373* (2006.01)
*H01L 23/00* (2006.01)

(52) U.S. Cl.
CPC .......... *H01L 23/3735* (2013.01); *H01L 24/48* (2013.01); *H01L 2224/48225* (2013.01); *H01L 2924/13055* (2013.01)

(58) Field of Classification Search
None
See application file for complete search history.

(56) References Cited

U.S. PATENT DOCUMENTS

| | | |
|---|---|---|
| 6,157,080 A | 12/2000 | Tamaki et al. |
| 11,183,588 B2 | 11/2021 | Satoh |
| 2021/0057555 A1 | 2/2021 | Satoh |

FOREIGN PATENT DOCUMENTS

| | | |
|---|---|---|
| DE | 698 34 702 T2 | 5/2007 |
| JP | 2013-149760 A | 8/2013 |
| JP | 2018-014354 A | 1/2018 |
| JP | 2021-034506 A | 3/2021 |

OTHER PUBLICATIONS

"Notice of Reasons for Refusal" Office Action issued in JP 2021-201732; mailed by the Japanese Patent Office on Oct. 1, 2024.
Office Action issued in DE 10 2022 127 071.8; mailed by the German Patent and Trademark Office on Jan. 13, 2025.
Anonymous; Direct Bonded Copper; Wikipedia; Oct. 18, 2018; total 4 pages; URL: https://de.wikipedia.org/wiki/Direct_Bonded_Copper.
"Decision of Refusal" Office Action issued in JP 2021-201732; mailed by the Japanese Patent Office on Feb. 4, 2025.

*Primary Examiner* — Anthony Ho
(74) *Attorney, Agent, or Firm* — Studebaker Brackett PLLC (57) ABSTRACT

A first principal electrode and a first control electrode pad are formed on a first principal surface of the semiconductor chip. A second principal electrode and a second control electrode pad are formed on a second principal surface of the semiconductor chip. The second principal electrode and the second control electrode pad are respectively bonded to first and second metal patterns of an insulating substrate. Bonding sections of first and second wires overlap a bonding section of the second principal electrode or the second control electrode pad in plan view. Thickness of the first and second metal patterns is 0.2 mm or less.

14 Claims, 12 Drawing Sheets

SEMICONDUCTOR DEVICE

BACKGROUND OF THE INVENTION

Field

The present disclosure relates to a semiconductor device.

Background

A semiconductor device of a double gate structure including a control electrode pad on each of a surface on a cathode side and a surface on an anode side has been proposed as a switching element. In an embodiment, wire-bonding is performed on the control electrode pads on both of the surfaces (see, for example, JP2021-34506A).

SUMMARY

If the surface on the opposite side cannot be fixed when the wire-bonding is performed, cracking or chipping of a semiconductor chip is caused by an impact of an ultrasound wave. Therefore, it is difficult to perform the wire-bonding to the control electrode pads present on both of the surfaces. Even if manufacturing of the semiconductor chip can be achieved in some special way, it is difficult to improve mass productivity.

The present disclosure has been made in order to solve the problems described above and an object of the present disclosure is to obtain a semiconductor device having a high yield and easily manufactured.

A semiconductor device according to the present disclosure includes: a semiconductor chip including a first principal surface and a second principal surface on opposite sides each other; a first principal electrode formed on the first principal surface and electrically connected to the semiconductor chip; a first control electrode pad formed on the first principal surface; a first insulating film formed between the semiconductor chip and the first control electrode pad; a second principal electrode formed on the second principal surface and electrically connected to the semiconductor chip; a second control electrode pad formed on the second principal surface; a second insulating film formed between the semiconductor chip and the second control electrode pad; a first wire bonded to the first principal electrode; a second wire bonded to the first control electrode pad; and an insulating substrate including first and second metal patterns separated from each other, wherein the second principal electrode and the second control electrode pad are respectively bonded to the first and second metal patterns, bonding sections of the first and second wires overlap a bonding section of the second principal electrode or the second control electrode pad in plan view, and thickness of the first and second metal patterns is 0.2 mm or less.

In the present disclosure, the second principal electrode and the second control electrode pad of the semiconductor chip are respectively bonded to the first and second metal patterns of the insulating substrate. Consequently, it is possible to easily assemble the semiconductor chip in a general soldering process flow. Bonding sections of the first and second wires overlap a bonding section of the second principal electrode or the second control electrode pad in the plan view. Since the opposite surface of the bonding section is fixed by the metal pattern, it is possible to prevent breakage of the semiconductor chip at a bonding time. The thickness of the metal patterns is set to 0.2 mm or less. Consequently, since pattern accuracy of the metal patterns is improved, it is easy to match the shapes of the metal patterns of the insulating substrate to the shapes of the collector electrode and the second gate electrode pad. It is possible to increase a bonding area of the metal patterns and the collector electrode and the second gate electrode pad. Therefore, mechanical strength increases and thermal resistance decreases. Accordingly, the semiconductor device according to the present disclosure has a high yield and is easily manufactured.

Other and further objects, features and advantages of the invention will appear more fully from the following description.

DESCRIPTION OF EMBODIMENTS

A semiconductor device according to the embodiments of the present disclosure will be described with reference to the drawings. The same components will be denoted by the same symbols, and the repeated description thereof may be omitted.

First Embodiment

Figure 1:
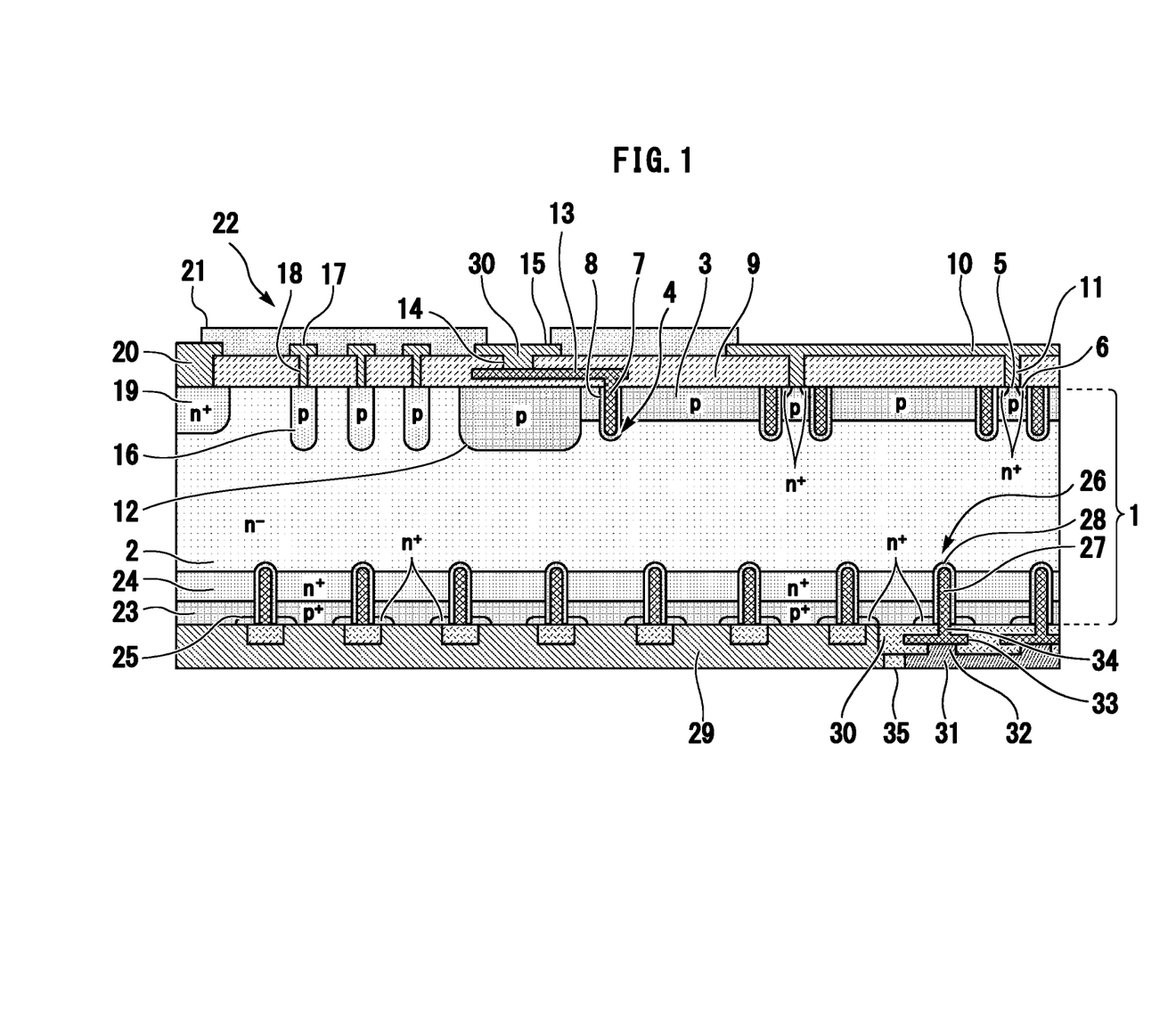
FIG. 1 is a sectional view illustrating a semiconductor chip of a double gate structure.

FIG. 1 is a sectional view illustrating a semiconductor chip of a double gate structure. A semiconductor chip 1 is an IGBT chip including an emitter side principal surface and a collector side principal surface on opposite sides each other. An $n^-$-type drift layer 2 is formed in the semiconductor chip 1. A p-type base layer 3 having predetermined thickness is formed on the $n^-$-type drift layer 2. A plurality of trenches 4 pierce the p-type base layer 3 and reach the $n^-$-type drift layer 2. The plurality of trenches 4 are arranged at a predetermined pitch (interval) and are formed in a stripe structure extending in parallel to a paper surface vertical direction in FIG. 1 or an annular structure extending in parallel and thereafter drawn around at the distal end portion thereof.

The p-type base layer 3 is separated into a plurality of layers by the plurality of trenches 4. A part of the plurality of layers is a p-channel layer 5 constituting a channel region. An $n^+$-type emitter region 6 is formed on a side surface of the trench 4 in a surface layer portion of the p-channel layer 5. The $n^+$-type emitter region 6 has higher impurity concentration than the $n^-$-type drift layer 2. A gate electrode 7 made of doped polysilicon or the like is formed in the trench 4 via a gate insulating film 8. An insulating film 9 is formed on the emitter side principal surface of the semiconductor chip 1 to cover the gate electrode 7 from above.

An emitter electrode 10 is formed on the insulating film 9. The emitter electrode 10 is electrically connected to the $n^+$-type emitter region 6 and the p-channel layer 5 through a contact hole 11 formed in the insulating film 9.

A p-type diffusion layer 12 is formed on the $n^-$-type drift layer 2 to surround the p-type base layer 3. A doped polysilicon layer 13 is formed on the p-type diffusion layer 12 via the insulating film 9. The doped polysilicon layer 13 is electrically connected to the gate electrode 7 and is electrically connected to a first gate electrode pad 15 through a contact hole 14 formed in the insulating film 9. Therefore, the gate electrode 7 is electrically connected to the outside through the doped polysilicon layer 13 and the first gate electrode pad 15. An emitter side IGBT region is established in this way.

In an outer peripheral region surrounding the emitter side IGBT region, a plurality of p-type guard ring layers 16 are formed as a multiplex ring structure on the $n^-$-type drift layer 2. The p-type diffusion layer 12 and the p-type guard ring layers 16 are formed deeper than the p-type base layer 3. A plurality of outer peripheral electrodes 17 are formed on the insulating film 9 and are connected to the plurality of p-type guard ring layers 16 through a contact hole 18. The plurality of outer peripheral electrodes 17 are electrically separated from one another and are formed in the multiplex ring structure like the p-type guard ring layers 16.

An $n^+$-type layer 19 is formed on the surface layer portion of the $n^-$-type drift layer 2 to surround the p-type guard ring layers 16. An electrode 20 is formed on the $n^+$-type layer 19.

The $n^+$-type layer 19 and the electrode 20 are electrically connected to each other to constitute an equipotential ring (EQR) structure. A part not electrically connected in the outer peripheral region is covered by a protection film 21. An outer peripheral withstand voltage holding structure 22 is established in the outer peripheral region of the emitter side principal surface in this way.

A $p^+$-type collector layer 23 is formed below the $n^-$-type drift layer 2. An $n^+$-type field stop layer 24 having higher impurity concentration than the $n^-$-type drift layer 2 is formed between the $n^-$-type drift layer 2 and the $p^+$-type collector layer 23. An $n^+$-type collector layer 25 having high concentration is selectively formed on a surface on a collector side of the $p^+$-type collector layer 23.

A plurality of trenches 26 are formed to pierce through the $p^+$-type collector layer 23, the $n^+$-type collector layer 25, and the $n^+$-type field stop layer 24 and reach the $n^-$-type drift layer 2. The plurality of trenches 26 are arranged in a stripe shape with a predetermined interval apart from one another, for example, at an equal interval. Control gate electrodes 27 made of doped polysilicon or the like are formed in the trenches 26 via gate insulating films 28. All of the control gate electrodes 27 are electrically connected to one another on separate cross sections.

A collector electrode 29 is in contact with and electrically connected to the p+-type collector layer 23 and the $n^+$-type collector layer 25. An insulating film 30 is formed on the collector side principal surface of the semiconductor chip 1 to cover the control gate electrodes 27.

A second gate electrode pad 31 is electrically connected to a doped polysilicon layer 33 through a contact hole 32 formed in the insulating film 30. The doped polysilicon layer 33 is connected to the control gate electrodes 27 through a contact hole 34 formed in the insulating film 30. The collector electrode 29 is arranged to surround the second gate electrode pad 31, the periphery of which is coated by a protection film 35, and is separated from the control gate electrodes 27 by the insulating film 30 and the protection film 35. A collector side IGBT region is established in this way.

Figure 2:
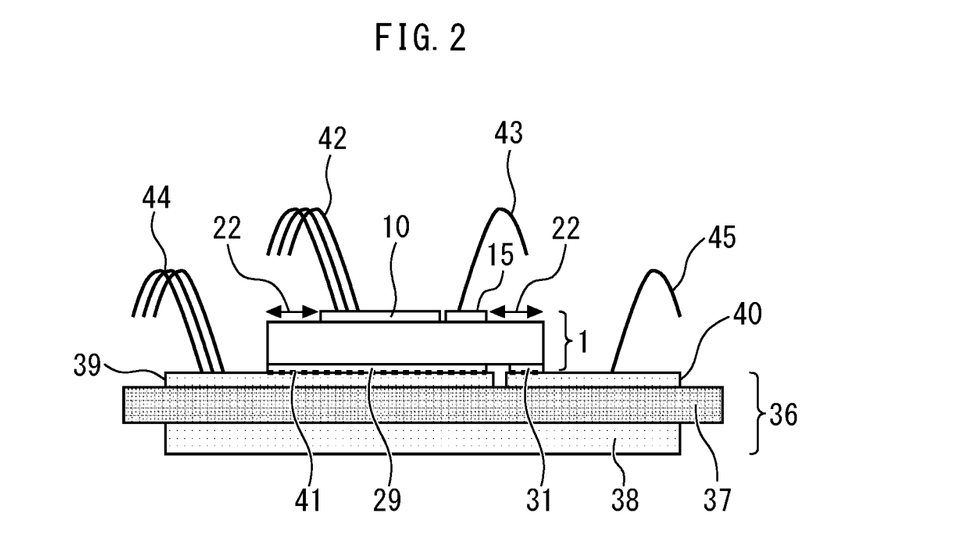
FIG. 2 is a sectional view illustrating a semiconductor device according to a first embodiment.

FIG. 2 is a sectional view illustrating a semiconductor device according to a first embodiment. The emitter electrode 10 and the first gate electrode pad 15 are formed on the emitter side principal surface of the semiconductor chip 1. The outer peripheral withstand voltage holding structure 22 is formed in the outer peripheral region surrounding the emitter electrode 10 and the first gate electrode pad 15 on the emitter side principal surface. The collector electrode 29 and the second gate electrode pad 31 are formed on the collector side principal surface of the semiconductor chip 1.

An insulating substrate 36 includes an insulating material 37, a metal layer 38 formed on the lower surface of the insulating material 37, and metal patterns 39 and 40 formed on the upper surface of the insulating material 37. The metal patterns 39 and 40 are separated from each other and are respectively bonded to the collector electrode 29 and the second gate electrode pad 31 of the semiconductor chip 1 by solder 41. Since the metal patterns 39 and 40 are separated, a control signal of approximately several volts to 20 volts can be given between the collector electrode 29 and the second gate electrode pad 31.

Wires 42 and 43 are respectively bonded to the emitter electrode 10 and the first gate electrode pad 15. Wires 44 and 45 are respectively bonded to the metal patterns 39 and 40. A bonding section of the wire 42 bonded to the emitter electrode 10 and a bonding section of the wire 43 bonded to the first gate electrode pad 15 overlap a solder section of the collector electrode 29 or the second gate electrode pad 31 in a plan view. Consequently, cracking due to an ultrasound wave at a wire bonding time can be prevented.

Figure 3:
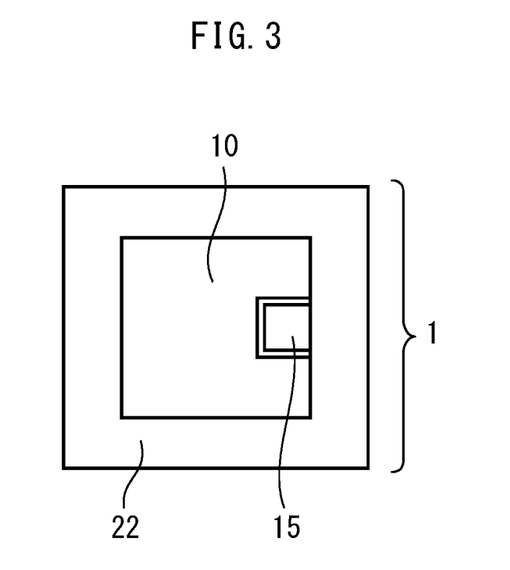
FIG. 3 is a top view of the semiconductor chip.

FIG. 3 is a top view of the semiconductor chip. The position of the first gate electrode pad 15 is a position slightly closer to one side from the chip center. Not only this, but the wire 43 can be bonded to the first gate electrode pad 15 irrespective of whether the position of the first gate electrode pad 15 is in the chip center or a position closer to one corner.

Figure 4:
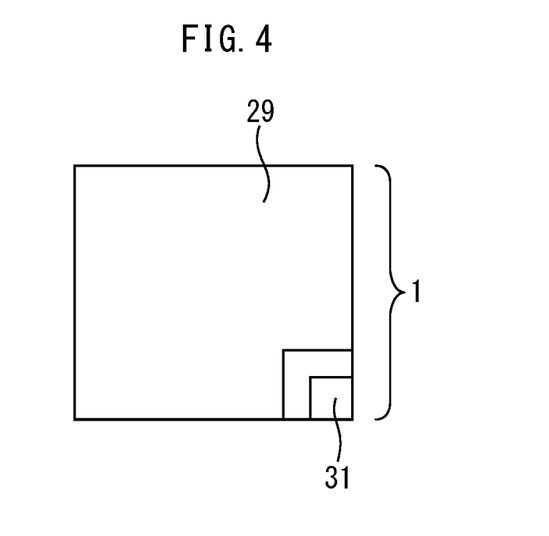
FIG. 4 is a bottom view of the semiconductor chip.

FIG. 4 is a bottom view of the semiconductor chip. The second gate electrode pad 31 is formed at a chip corner. Not only this, but the second gate electrode pad 31 may be provided in the chip center or may be provided on any side. When the second gate electrode pad 31 is provided at the chip corner or on the side, the metal pattern 39 bonded to the collector electrode 29 and the metal pattern 40 bonded to the second gate electrode pad 31 do not cross and the patterns are easily formed. The second gate electrode pad 31 can also be formed in the chip center. However, as explained below, it is necessary to insulate the metal patterns 39 and 40 from each other and use the insulating substrate 36 of the multilayer electrode layer and a via.

Figure 5:
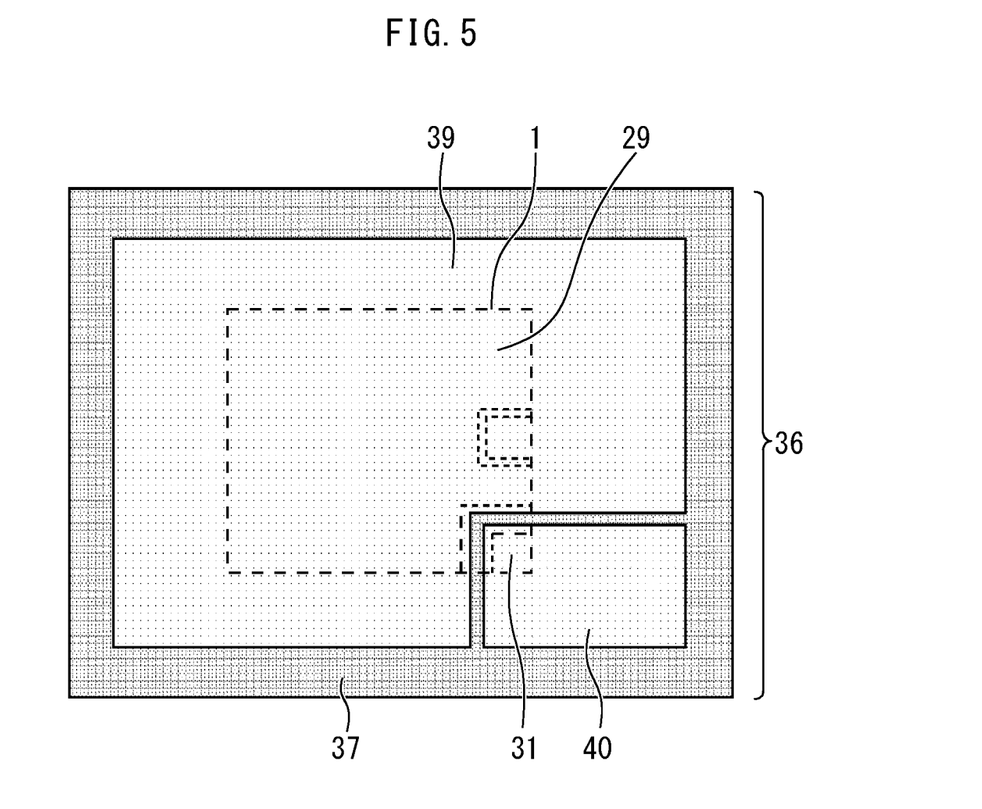
FIG. 5 is a plan view illustrating a positional relation between the metal patterns of the insulating substrate and the semiconductor chip according to the first embodiment.

FIG. 5 is a plan view illustrating a positional relation between the metal patterns of the insulating substrate and the semiconductor chip according to the first embodiment. A dotted line indicates the semiconductor chip 1. A portion where the metal patterns 39 and 40 are not formed in the insulating substrate 36 and a portion where the collector electrode 29 and the gate electrode pad 31 are not formed in the semiconductor chip 1 are matched. Consequently, it is possible to prevent a short circuit of the collector electrode 29 and the second gate electrode pad 31 and give a control signal to the second gate electrode pad 31. In this embodiment, a pattern interval of the insulating substrate 36 is set smaller compared with a pattern interval of the semiconductor chip 1. Not only this, but, since the collector electrode 29 and the second gate electrode pad 31 only have to be not in contact and short-circuited, the pattern interval of the semiconductor chip 1 may be larger or both of the patterns may coincide with each other.

Figure 6:
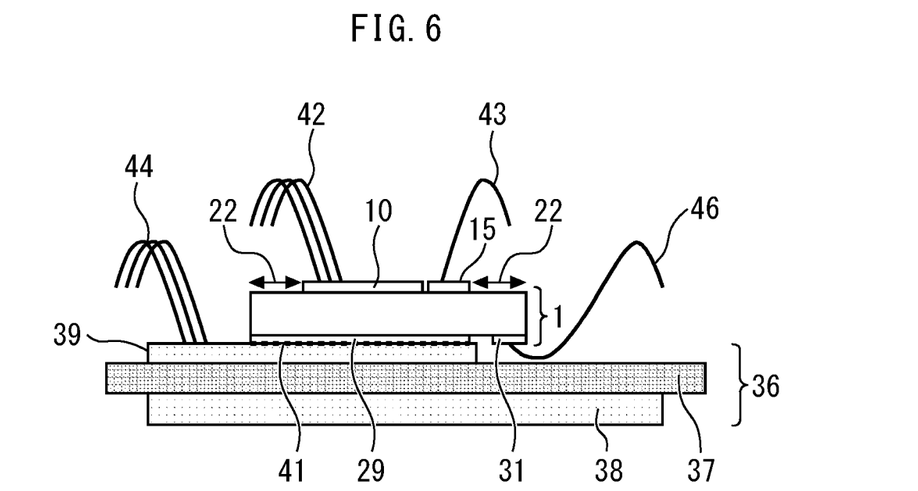
FIG. 6 is a sectional view illustrating a semiconductor device according to the comparative example.

Subsequently, effects of this embodiment are explained in comparison with a comparative example. FIG. 6 is a sectional view illustrating a semiconductor device according to the comparative example. In the comparative example, a wire 46 is directly bonded to the second gate electrode pad 31 on the chip lower surface. However, since wire bonding is present on the chip upper surface as well, the chip upper surface cannot be fixed by solder or the like. Therefore, cracking or chipping of the semiconductor chip 1 is caused by an impact of an ultrasound wave at a wire bonding time. In order to avoid this, when soldering of the chip lower surface is performed first, a needle tip (a tool) for radiating an ultrasound wave and melting a wire cannot be applied to the second gate electrode pad 31 by being hindered by the insulating substrate 36. Therefore, it is difficult to manufacture the semiconductor device of the comparative example. Even if the semiconductor device of the comparative example can be manufactured by a special method, it is difficult to improve mass productivity.

In contrast, in this embodiment, the collector electrode 29 and the second gate electrode pad 31 of the semiconductor chip 1 are respectively soldered to the metal patterns 39 and 40 of the insulating substrate 36. Consequently, it is possible to easily assemble the semiconductor chip 1 in a general soldering process flow.

A bonding section of the wires 42 and 43 overlaps a soldering section of the collector electrode 29 and the second gate electrode pad 31 in the plan view. Since the opposite surface of the bonding section is fixed, it is possible to prevent breakage of the semiconductor chip 1 at a bonding time.

Figure 7:
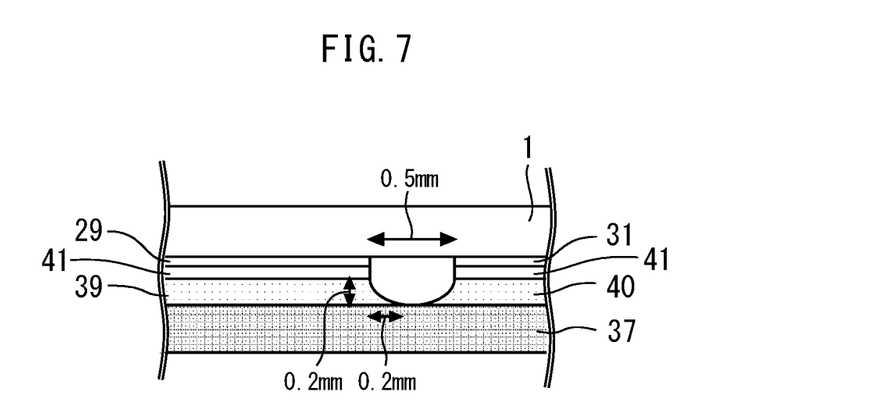
FIG. 7 is an enlarged sectional view of a bonding section of the insulating substrate and the semiconductor chip.

FIG. 7 is an enlarged sectional view of a bonding section of the insulating substrate and the semiconductor chip. From matching accuracy of patterns of the semiconductor chip 1 and the insulating substrate 36 and an insulation distance between electrodes, an interval between the collector electrode 29 and the second gate electrode pad 31 is set to 0.5 mm or less. Since a metal pattern can be more finely machined as the thickness thereof is smaller, it is necessary to reduce the thickness of the metal patterns 39 and 40 connected to the collector electrode 29 and the second gate electrode pad 31. Wet etching with high productivity is used for machining of the metal patterns 39 and 40. Therefore, considering that side etches equivalent to pattern thickness are present from both sides, the thickness of the metal patterns 39 and 40 is set to 0.2 mm or less. Consequently, since pattern accuracy of the metal patterns 39 and 40 is improved, it is easy to match the shapes of the metal patterns 39 and 40 of the insulating substrate 36 to the shapes of the collector electrode 29 and the second gate electrode pad 31. It is possible to increase a bonding area of the metal patterns 39 and 40 and the collector electrode 29 and the second gate electrode pad 31. Therefore, mechanical strength increases and thermal resistance decreases. Accordingly, the semiconductor device according to this embodiment has a high yield and is easily manufactured.

Note that as a metal pattern is thicker, electric resistance in the lateral direction is smaller and a larger electric current can be fed, thermal resistance in the lateral direction also decreases, heat spreads to a chip periphery, and heat radiation is improved. Accordingly, the thickness of a general metal pattern is approximately 0.3 mm. In contrast, in the present disclosure, the thickness of the metal patterns 39 and 40 is intentionally set to 0.2 mm or less because of the above reason.

Figure 8:
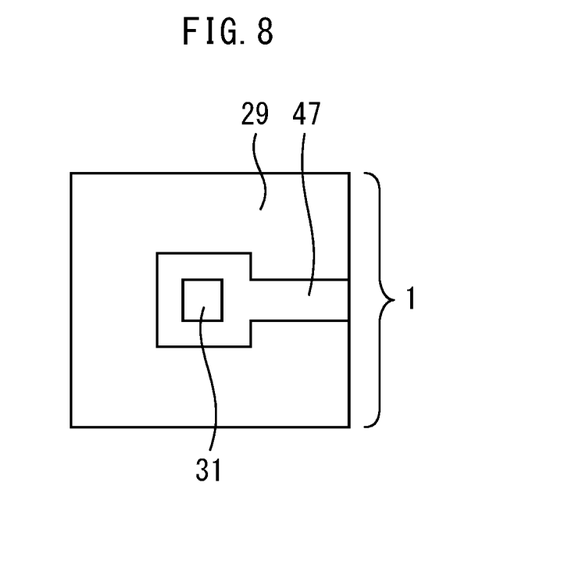
FIG. 8 is a bottom view illustrating a modification 1 of the semiconductor chip according to the first embodiment.
Figure 9:
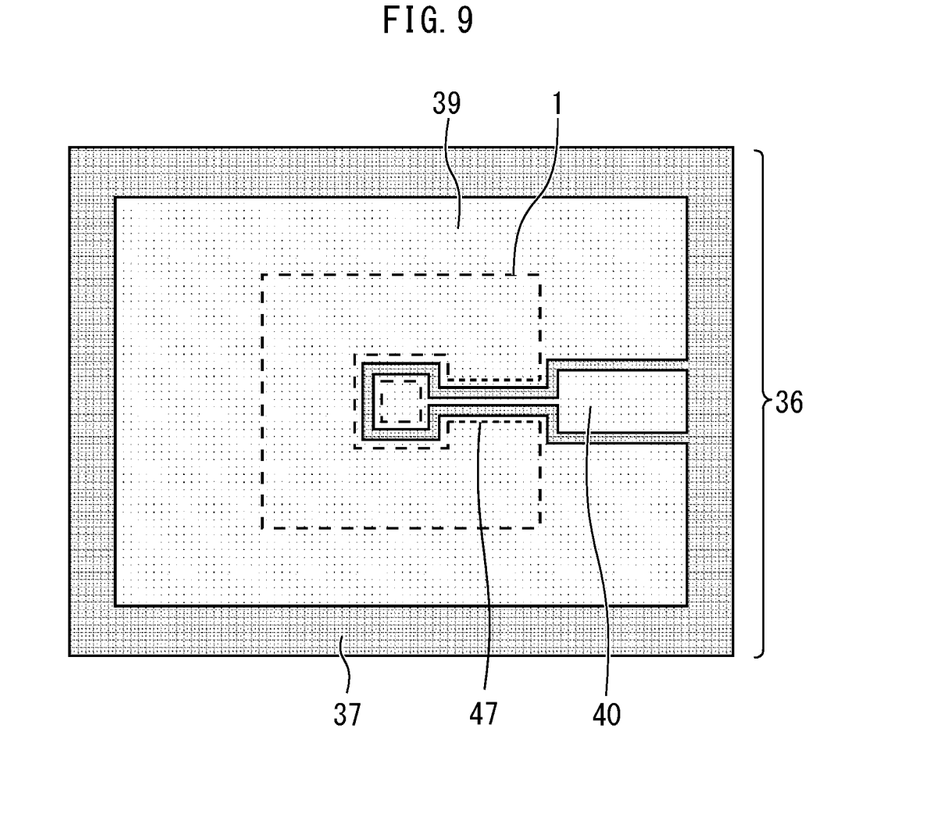
FIG. 9 is a top view illustrating metal patterns of an insulating substrate according to the modification 1 of the first embodiment.

FIG. 8 is a bottom view illustrating a modification 1 of the semiconductor chip according to the first embodiment. The second gate electrode pad 31 is formed in the center portion of the lower surface of the semiconductor chip 1 and the collector electrode 29 is formed around the second gate electrode pad 31. A slit 47 where the collector electrode 29 is absent is formed on a part of the lower surface of the semiconductor chip 1 from the center portion toward the outer peripheral portion of the semiconductor chip 1. FIG. 9 is a top view illustrating metal patterns of an insulating substrate according to the modification 1 of the first embodiment. The metal patterns 39 and 40 are separated from each other. The metal pattern 40 is drawn out from the center portion of the semiconductor chip 1 to the outer side of the semiconductor chip 1 through the slit 47 in the plan view. Consequently, since the metal pattern 40 is not in contact with the collector electrode 29, it is possible to prevent a short circuit of the collector electrode 29 and the second gate electrode pad 31.

Figure 10:
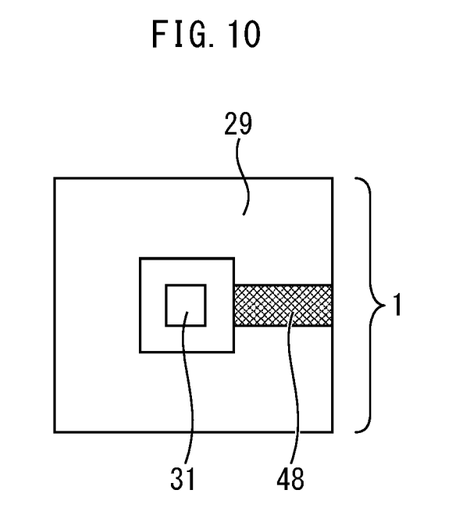
FIG. 10 is a bottom view illustrating a modification 2 of the semiconductor chip according to the first embodiment.

FIG. 10 is a bottom view illustrating a modification 2 of the semiconductor chip according to the first embodiment. The second gate electrode pad 31 is formed in the center portion of the lower surface of the semiconductor chip 1 and the collector electrode 29 is formed around the second gate electrode pad 31. An insulating film 48 is formed to cover a part of the collector electrode 29 from the center portion toward the outer peripheral portion of the semiconductor chip 1. The metal patterns 39 and 40 of the insulating substrate 36 are the same as those in the modification 1. The metal pattern 40 is drawn out, in the plan view, from the center portion of the semiconductor chip 1 to the outer side of the semiconductor chip 1 through a region where the insulating film 48 is formed. Consequently, since the metal pattern 40 is not in contact with the collector electrode 29, it is possible to prevent a short circuit of the collector electrode 29 and the second gate electrode pad 31. Note that the insulating film 48 may be formed after the modifications 1 and 2 are combined to avoid interference due to patterning of the collector electrode 29. If the collector electrode 29 and the second gate electrode pad 31 are not short-circuited, another pattern in which the second gate electrode pad 31 is arranged at a chip corner may be adopted.

Second Embodiment

Figure 11:
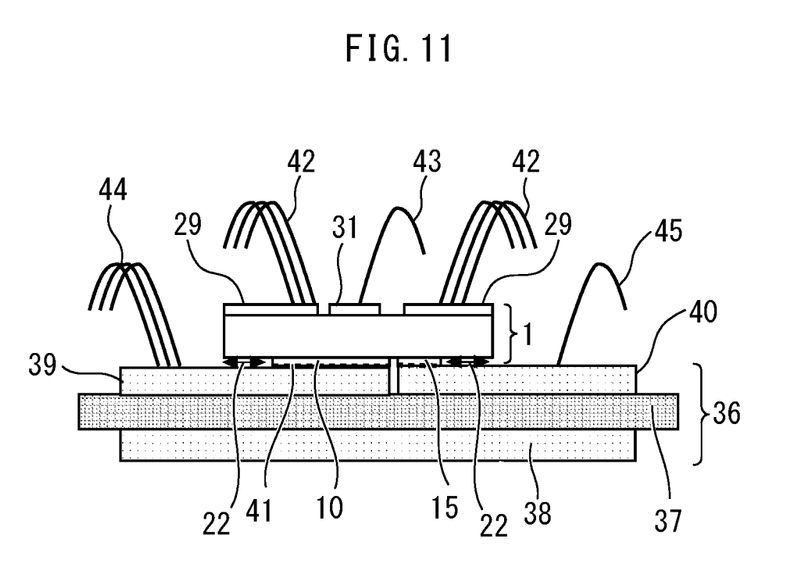
FIG. 11 is a sectional view illustrating a semiconductor device according to a second embodiment.

FIG. 11 is a sectional view illustrating a semiconductor device according to a second embodiment. Compared with the first embodiment, the semiconductor chip 1 is vertically revered and implemented. The emitter electrode 10 and the first gate electrode pad 15 of the semiconductor chip 1 are respectively soldered to the metal patterns 39 and 40 of the insulating substrate 36. The wires 42 and 43 are respectively bonded to the collector electrode 29 and the second gate electrode pad 31. Since the emitter side of the semiconductor chip 1 having large heat generation is bonded to the insulating substrate 36, which is a heat radiation path, more excellent heat radiation than in the first embodiment is achieved.

When electrode pads for temperature sense or current sense are formed on the emitter side of the semiconductor chip 1, the electrode pads and metal patterns of the insulating substrate 36 can also be bonded. Note that, when the first gate electrode pad 15 is arranged in the chip center, the configurations of the modifications 1 and 2 of the first embodiment are applied.

Figure 12:
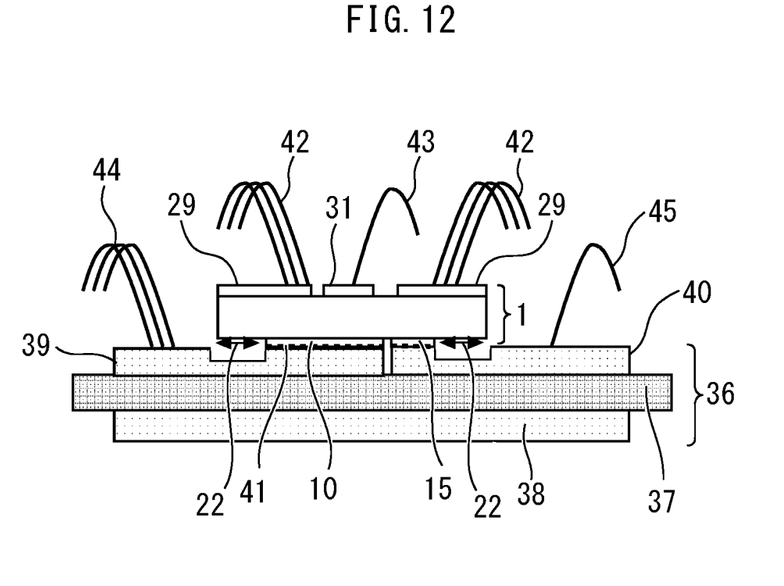
FIG. 12 is a sectional view illustrating a modification of the semiconductor device according to the second embodiment.

FIG. 12 is a sectional view illustrating a modification of the semiconductor device according to the second embodiment. A voltage of several thousand volts is applied between the outer peripheral portion of the outer peripheral withstand voltage holding structure 22 and the metal pattern 39. Therefore, for insulation, a part of the metal pattern 39 is partially reduced in thickness in a region opposed to the outer peripheral withstand voltage holding structure 22 compared with the periphery to expand the distance between the outer peripheral withstand voltage holding structure 22 and the metal pattern 39.

Third Embodiment

Figure 13:
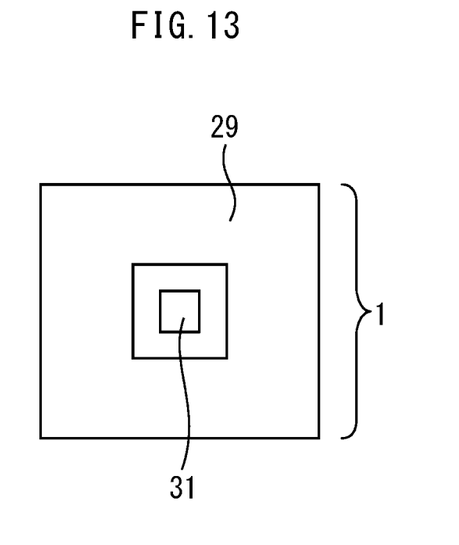
FIG. 13 is a bottom view illustrating a semiconductor chip according to a third embodiment.

FIG. 13 is a bottom view illustrating a semiconductor chip according to a third embodiment. The second gate electrode pad 31 is formed in the center portion of the lower surface of the semiconductor chip 1. The collector electrode 29 is formed around the second gate electrode pad 31.

Figure 14:
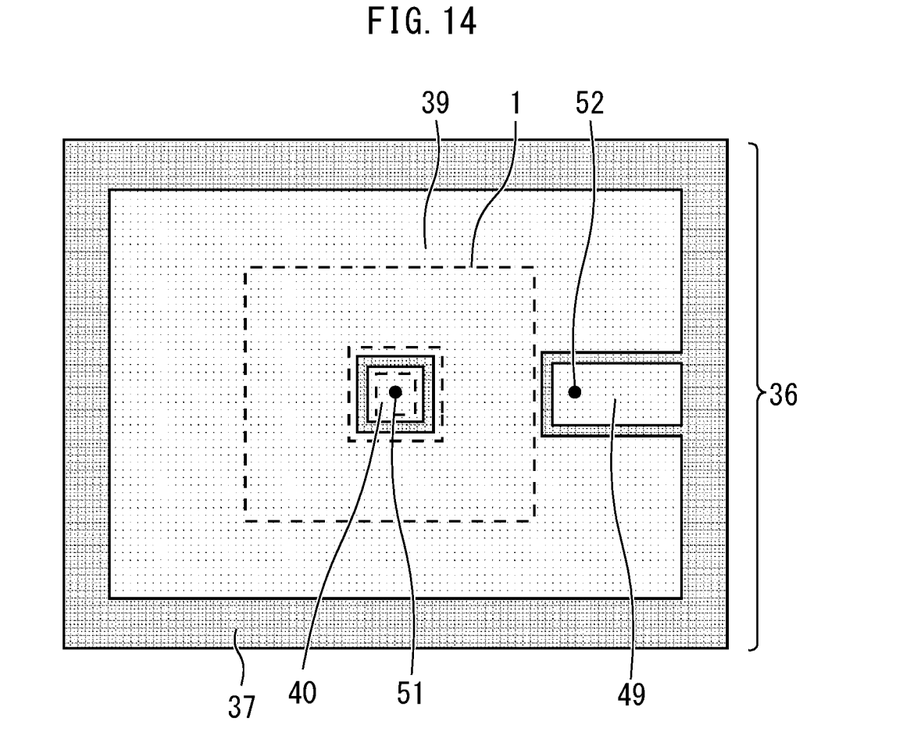
FIG. 14 is a top view illustrating an insulating substrate according to the third embodiment.

FIG. 14 is a top view illustrating an insulating substrate according to the third embodiment. The metal pattern 39 is formed around the metal pattern 40. A metal pattern 49 is formed in a position on the outer side of the semiconductor chip in a plan view. The metal patterns 39, 40, and 49 are separated from one another.

Figure 15:
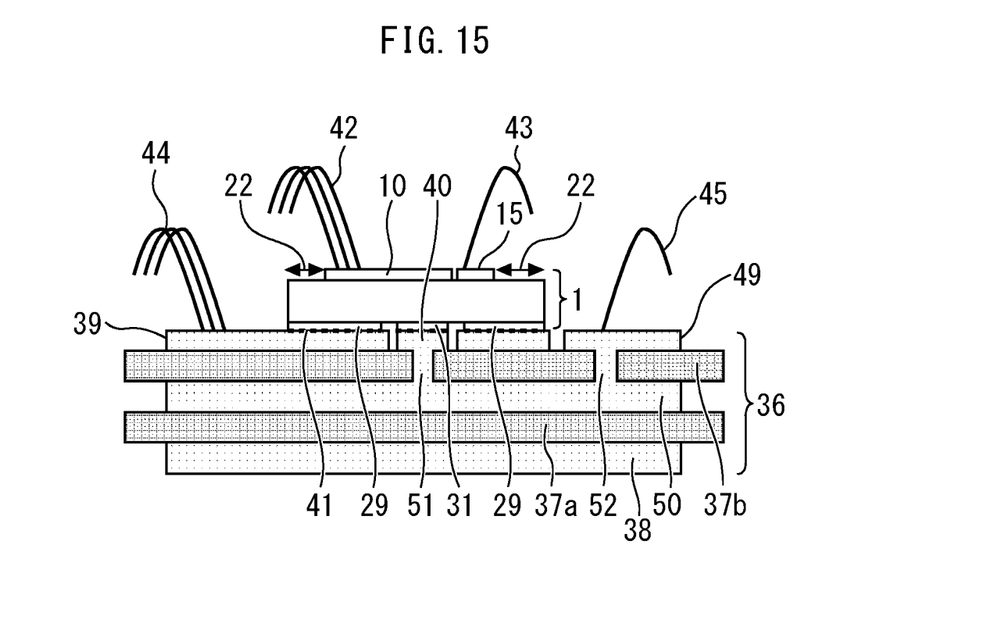
FIG. 15 is a sectional view illustrating a semiconductor device according to the third embodiment.

FIG. 15 is a sectional view illustrating a semiconductor device according to the third embodiment. The metal layer 38 formed on the lower surface of an insulating layer 37a is used for the ground and is not used as a metal pattern for a safety reason. A metal layer 50 is formed on the insulating layer 37a. An insulating layer 37b is formed on the metal layer 50. The metal patterns 39, 40, and 49 are formed on the insulating layer 37b. Therefore, the insulating substrate includes three conductor layers.

An opening 51 is formed in the insulating layer 37b. The metal layer 50 inside the substrate is connected to the metal pattern 40 via the opening 51. The metal layer 50 is connected to the metal pattern 49 via a via 52 formed in the insulating layer 37b. Consequently, the second gate electrode pad 31 formed in the center portion of the lower surface of the semiconductor chip 1 can be drawn out to the outside via the metal pattern 40, the metal layer 50, and the metal pattern 49. The other components and effects are the same as those in the first embodiment.

Figure 16:
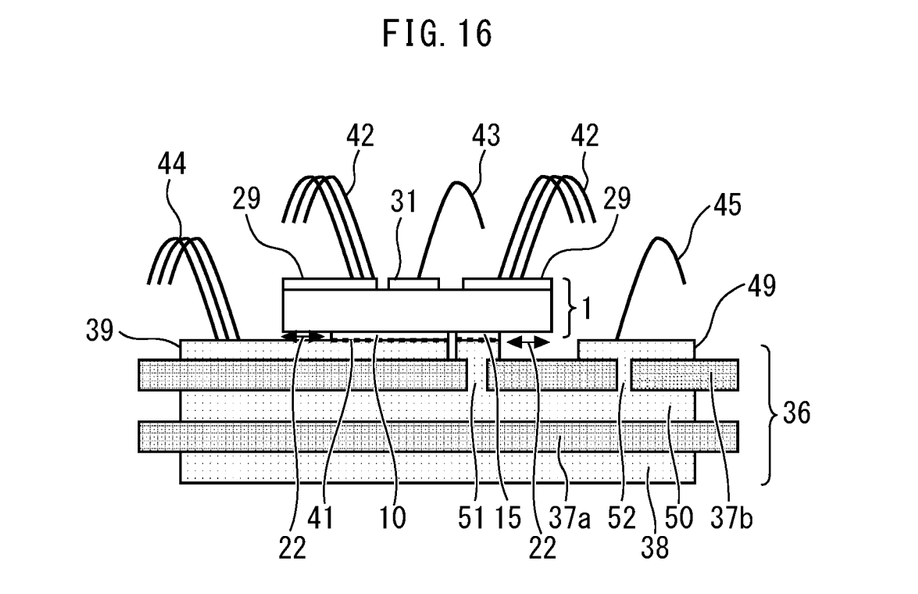
FIG. 16 is a sectional view illustrating a modification 1 of the semiconductor device according to the third embodiment.

FIG. 16 is a sectional view illustrating a modification 1 of the semiconductor device according to the third embodiment. The configuration of the second embodiment is combined and the semiconductor chip 1 is vertically reversed and implemented compared with the third embodiment. The emitter electrode 10 and the first gate electrode pad 15 of the semiconductor chip 1 are respectively soldered to the metal patterns 39 and 40 of the insulating substrate 36. The wires 42 and 43 are respectively bonded to the collector electrode 29 and the second gate electrode pad 31. Since the emitter side of the semiconductor chip 1 having large heat generation is bonded to the insulating substrate 36, which is a heat radiation path, more excellent heat radiation than in the third embodiment is achieved.

When electrode pads for temperature sense or current sense are formed on the emitter side of the semiconductor chip 1, the electrode pads and metal patterns of the insulating substrate 36 can also be bonded. Note that, when the first gate electrode pad 15 is arranged in the chip center, the configurations of the modifications 1 and 2 of the first embodiment are applied.

Figure 17:
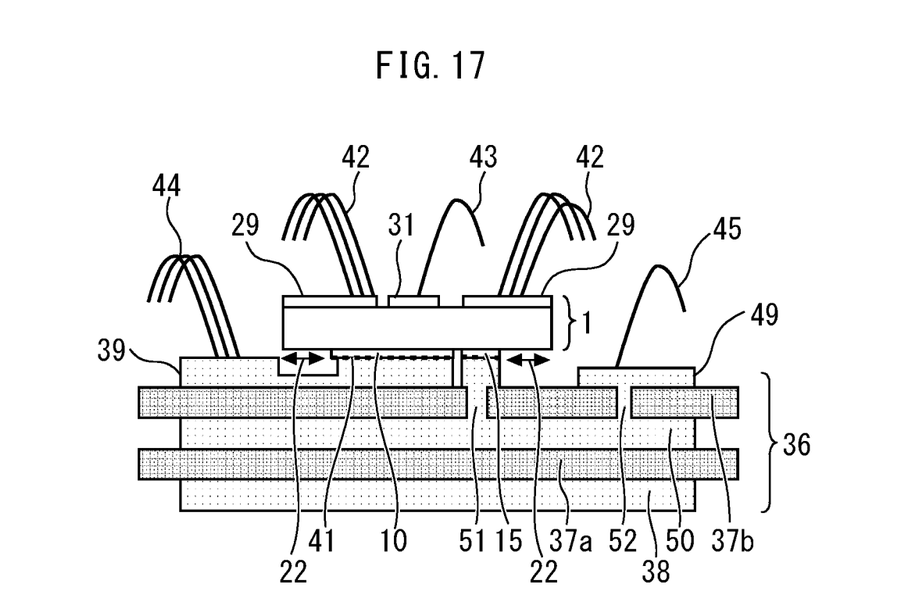
FIG. 17 is a sectional view illustrating a modification 2 of the semiconductor device according to the third embodiment.

FIG. 17 is a sectional view illustrating a modification 2 of the semiconductor device according to the third embodiment. The configuration of the second embodiment is combined and a voltage of several thousand volts is applied between the outer peripheral portion of the outer peripheral withstand voltage holding structure 22 and the metal pattern 39. Therefore, for insulation, a part of the metal pattern 39 is partially reduced in thickness in a region opposed to the outer peripheral withstand voltage holding structure 22 compared with the periphery to expand the distance between the outer peripheral withstand voltage holding structure 22 and the metal pattern 39.

Fourth Embodiment

Figure 18:
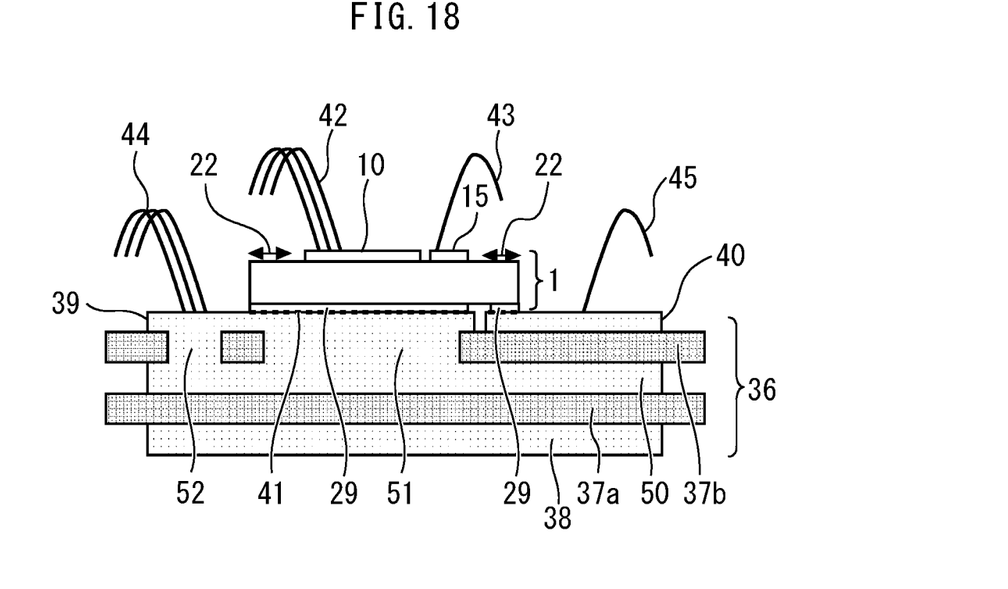
FIG. 18 is a sectional view illustrating a semiconductor device according to a fourth embodiment.

FIG. 18 is a sectional view illustrating a semiconductor device according to a fourth embodiment. A large opening 51 is formed right under the semiconductor chip 1 in the insulating layer 37b closer to the chip. The metal layer 50 is connected to the metal pattern 39 via the opening 51.

A loss (resistance) is small because an electric current flows in the thick metal layer 50 via the opening 51 even if the metal patterns 39 and 40 bonded to the semiconductor chip 1 is as thin as 0.2 mm or less. Thermal resistance does not rise because heat is radiated via the metal layer 50 of the opening 51.

Figure 19:
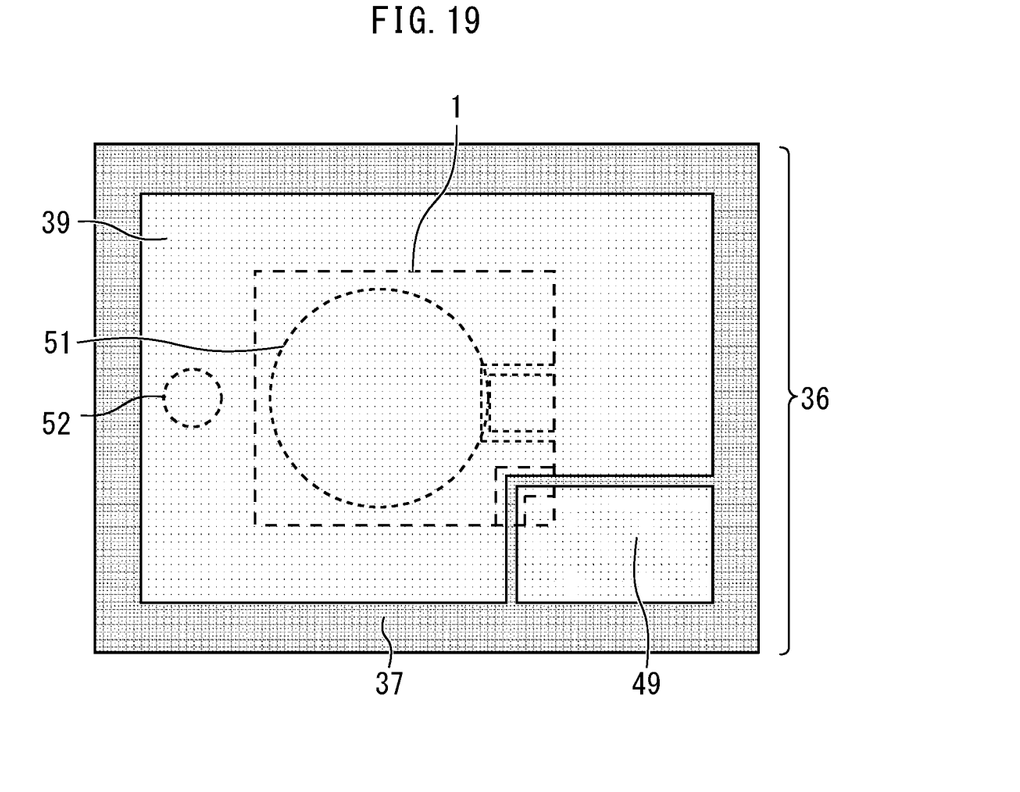
FIG. 19 is a plan view illustrating a positional relation between a metal pattern of an insulating substrate and a semiconductor chip according to the fourth embodiment.

FIG. 19 is a plan view illustrating a positional relation between a metal pattern of an insulating substrate and a semiconductor chip according to the fourth embodiment. The opening 51 is circular and is arranged to overlap the semiconductor chip 1 in a plan view. A via 52 having a small diameter is formed for the extension of the metal layer 50 on an inner side to the metal pattern 39 on the surface side.

Figure 20:
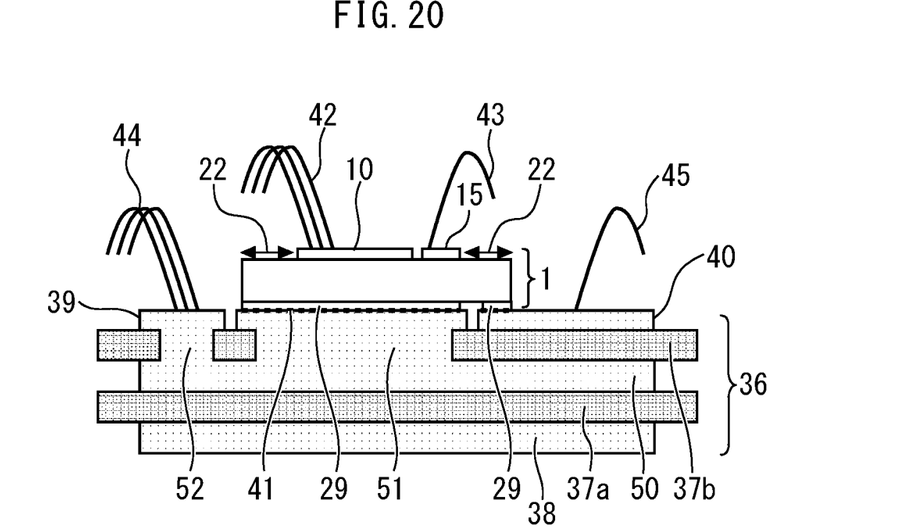
FIG. 20 is a sectional view illustrating a modification 1 of the semiconductor device according to the fourth embodiment.

FIG. 20 is a sectional view illustrating a modification 1 of the semiconductor device according to the fourth embodiment. In the metal pattern 39, a bonding section to the semiconductor chip 1 and a bonding section to the wire 44 are separated. Since the semiconductor chip 1 and the wire 44 are electrically connected by the metal layer 50, there is no problem in this form. However, the semiconductor chip 1 and the wire 44 are preferably not separated from the viewpoint of heat radiation and a reduction of a loss.

Figure 21:
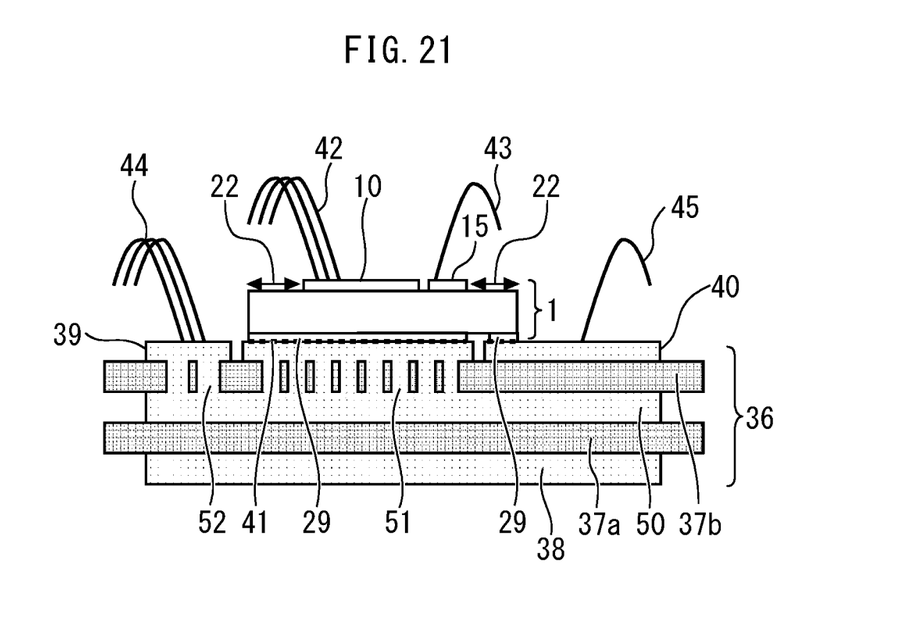
FIG. 21 is a sectional view illustrating a modification 2 of the semiconductor device according to the fourth embodiment.

FIG. 21 is a sectional view illustrating a modification 2 of the semiconductor device according to the fourth embodiment. A special machining technique is necessary for formation of the opening 51 having a large diameter illustrated in FIGS. 18 and 19. Therefore, a plurality of openings 51 having a small diameter are formed instead of the opening 51 having the large diameter. Consequently, cost is reduced and productivity is improved without increasing a loss and thermal resistance.

The insulating layer 37a and the insulating layer 37b are made of the same material. Therefore, it is easy to integrally form the insulating layer 37a and the insulating layer 37b. Since coefficients of thermal expansion of the insulating layer 37a and the insulating layer 37b are the same, reliability is high.

Fifth Embodiment

Figure 22:
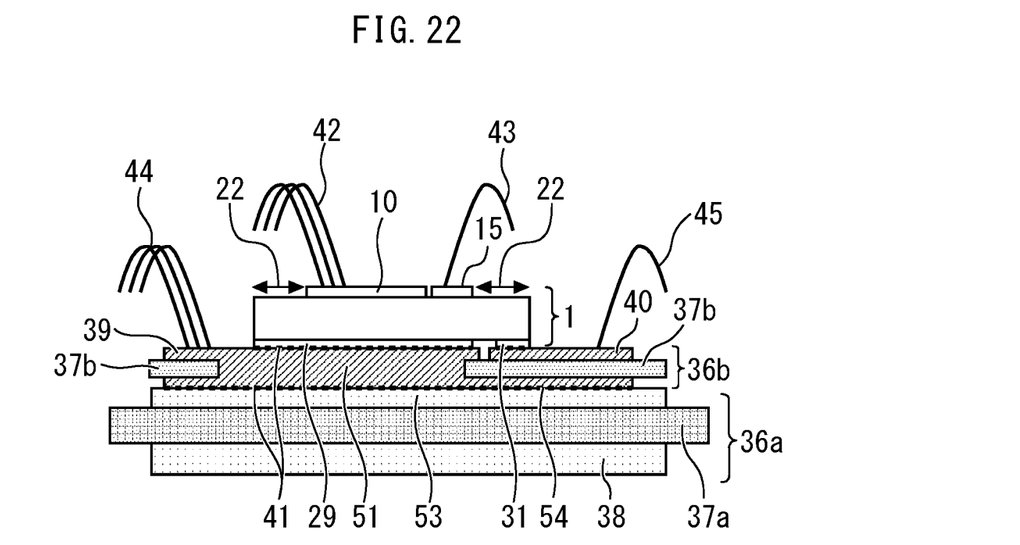
FIG. 22 is a sectional view illustrating a semiconductor device according to a fifth embodiment.

FIG. 22 is a sectional view illustrating a semiconductor device according to a fifth embodiment. An insulating substrate 36b is stacked on an insulating substrate 36a. In the insulating substrate 36a, the metal layer 38 is formed on the lower surface of the insulating layer 37a and a metal layer 53 is formed on the upper surface of the insulating layer 37a. In the insulating substrate 36b, a metal layer 54 is formed on the lower surface of the insulating layer 37b and the metal patterns 39 and 40 are formed on the upper surface of the insulating layer 37b. The metal layer 53 of the insulating substrate 36a is bonded to the metal layer 54 of the insulating substrate 36b by the solder 41. Note that another bonding material such as silver nano paste or copper nano paste may be used instead of the solder 41. The insulating layer 37a and the insulating layer 37b may be integrally formed. A metal layer between the insulating layer 37a and the insulating layer 37b may be one layer.

Refining of a pattern, accuracy, easiness of machining of the opening 51, and workability such as cracking hardness are required of the insulating layer 37b close to the semiconductor chip 1. On the other hand, heat radiation, that is, low thermal resistance is required of the insulating layer 37a far from the semiconductor chip 1. Accordingly, the insulating layer 37a and the insulating layer 37b are made of different materials. Optimum insulating materials are selected for the insulating layer 37a and the insulating layer 37b. Specifically, the insulating layer 37a is a ceramic substrate of aluminum nitride, silicon nitride, alumina, or the like having low thermal resistance. The insulating layer 37b is a glass epoxy substrate or a resin sheet. Since the ceramic substrate is easily cracked and a brazing material is used for sticking an insulating substrate and a metal pattern, pattern accuracy is poor and a smallest dimension and an error are large. On the other hand, since the glass epoxy substrate or the resin sheet is hardly cracked and the insulating substrate and the metal sheet are stuck by heat press, pattern accuracy is high.

Figure 23:
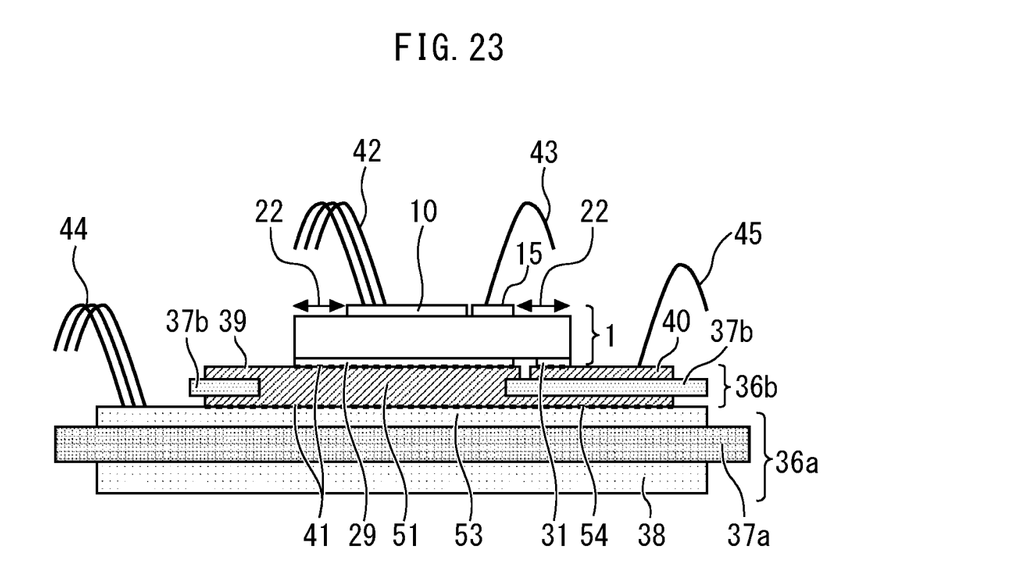
FIG. 23 is a sectional view illustrating a modification of the semiconductor device according to the fifth embodiment.

FIG. 23 is a sectional view illustrating a modification of the semiconductor device according to the fifth embodiment. In FIG. 22, the wire 44 is bonded to the metal pattern 39 of the insulating substrate 36b. However, in FIG. 23, the wire 44 is bonded to the metal layer 53 of the insulating substrate 36a. This results in a decreased loss.

The semiconductor chip 1 is not limited to a semiconductor chip formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor chip formed of such a wide-bandgap semiconductor has a high voltage resistance and a high allowable current density, and thus can be miniaturized. The use of such a miniaturized semiconductor chip enables the miniaturization and high integration of the semiconductor device in which the semiconductor chip is incorporated. Further, since the semiconductor chip has a high heat resistance, a radiation fin of a heatsink can be miniaturized and a water-cooled part can be air-cooled, which leads to further miniaturization of the semiconductor device. Further, since the semiconductor chip has a low power loss and a high efficiency, a highly efficient semiconductor device can be achieved.

Obviously many modifications and variations of the present disclosure are possible in the light of the above teachings. It is therefore to be understood that within the scope of the appended claims the invention may be practiced otherwise than as specifically described.

The entire disclosure of Japanese Patent Application No. 2021-201732, filed on Dec. 13, 2021 including specification, claims, drawings and summary, on which the convention priority of the present application is based, is incorporated herein by reference in its entirety.

The invention claimed is:
1. A semiconductor device comprising:
a semiconductor chip including a first principal surface and a second principal surface on opposite sides each other;
a first principal electrode formed on the first principal surface and electrically connected to the semiconductor chip;
a first control electrode pad formed on the first principal surface;
a first insulating film formed between the semiconductor chip and the first control electrode pad;
a second principal electrode formed on the second principal surface and electrically connected to the semiconductor chip;
a second control electrode pad formed on the second principal surface;
a second insulating film formed between the semiconductor chip and the second control electrode pad;
a first wire bonded to the first principal electrode;
a second wire bonded to the first control electrode pad; and
an insulating substrate including first and second metal patterns separated from each other,
wherein the second principal electrode and the second control electrode pad are respectively bonded to the first and second metal patterns,
bonding sections of the first and second wires overlap a bonding section of the second principal electrode or the second control electrode pad in plan view, and
thickness of the first and second metal patterns is 0.2 mm or less.

2. The semiconductor device according to claim 1, wherein an interval between the second principal electrode and the second control electrode pad is 0.5 mm or less.

3. The semiconductor device according to claim 1, wherein the second control electrode pad is formed in a center portion of the second principal surface of the semiconductor chip,
- a slit where the second principal electrode is absent is formed on a part of the second principal surface from the center portion toward an outer peripheral portion of the second principal surface, and
- the second metal pattern is drawn out from a center portion of the semiconductor chip to an outer side of the semiconductor chip through the slit in plan view.

4. The semiconductor device according to claim 1, wherein the second control electrode pad is formed in a center portion of the second principal surface of the semiconductor chip,
- an insulating film is formed to cover a part of the second principal electrode from the center portion toward an outer peripheral portion of the second principal surface, and
- the second metal pattern is drawn out from a center portion of the semiconductor chip to an outer side of the semiconductor chip through a region where the insulating film is formed.

5. A semiconductor device comprising:
- a semiconductor chip including a first principal surface and a second principal surface on opposite sides each other;
- a first principal electrode formed on the first principal surface and electrically connected to the semiconductor chip;
- a first control electrode pad formed on the first principal surface;
- a first insulating film formed between the semiconductor chip and the first control electrode pad;
- a second principal electrode formed on the second principal surface and electrically connected to the semiconductor chip;
- a second control electrode pad formed on the second principal surface;
- a second insulating film formed between the semiconductor chip and the second control electrode pad;
- a first wire bonded to the second principal electrode;
- a second wire bonded to the second control electrode pad; and
- an insulating substrate including first and second metal patterns separated from each other,
- wherein the first principal electrode and the first control electrode pad are respectively bonded to the first and second metal patterns,
- bonding sections of the first and second wires overlap a bonding section of the first principal electrode or the first control electrode pad in plan view, and
- thickness of the first and second metal patterns is 0.2 mm or less.

6. The semiconductor device according to claim 5, further comprising an outer peripheral withstand voltage holding structure established in an outer peripheral region of the first principal surface and surrounding the first principal electrode and the first control electrode pad,
- wherein a part of the first metal pattern is partially reduced in thickness in a region opposed to the outer peripheral withstand voltage holding structure.

7. The semiconductor device according to claim 1, wherein an insulating substrate includes a first insulating layer, a metal layer formed on the first insulating layer, and a second insulating layer formed on the metal layer,
- first and second metal patterns are formed on the second insulating layer,
- an opening is formed in the second insulating layer, and
- the metal layer is connected to the first and second metal patterns via the opening.

8. The semiconductor device according to claim 7, comprising:
- a third metal pattern formed on the second insulating layer and separated from the first and second metal patterns; and
- a via formed in the second insulating layer and connecting the metal layer and the third metal pattern,
- wherein the metal layer is connected to the second metal pattern via the opening.

9. The semiconductor device according to claim 7, wherein the opening is formed right under the semiconductor chip, and
- the first metal layer is connected to the first metal pattern via the opening.

10. The semiconductor device according to claim 7, wherein the first insulating layer and the second insulating layer are made of the same material.

11. The semiconductor device according to claim 7, wherein the first insulating layer and the second insulating layer are made of different materials.

12. The semiconductor device according to claim 11, wherein the first insulating layer is a ceramic substrate, and
- the second insulating layer is a glass epoxy substrate or a resin sheet.

13. The semiconductor device according to claim 1, wherein the semiconductor chip is an IGBT or a RC-IGBT.

14. The semiconductor device according to claim 1, wherein the semiconductor chip is made of a wide-band-gap semiconductor.

* * * * *